United States Patent
Kapoor et al.

(10) Patent No.: US 7,898,297 B2
(45) Date of Patent: Mar. 1, 2011

(54) METHOD AND APPARATUS FOR DYNAMIC THRESHOLD VOLTAGE CONTROL OF MOS TRANSISTORS IN DYNAMIC LOGIC CIRCUITS

(75) Inventors: Ashok Kumar Kapoor, Palo Alto, CA (US); Robert Strain, San Jose, CA (US); Reuven Marko, Netanya (IL)

(73) Assignee: Semi Solution, LLC, Los Gatos, CA (US)

( * ) Notice: Subject to any disclaimer, the term of this patent is extended or adjusted under 35 U.S.C. 154(b) by 1026 days.

(21) Appl. No.: 11/684,466

(22) Filed: Mar. 9, 2007

(65) Prior Publication Data

US 2007/0229145 A1 Oct. 4, 2007

Related U.S. Application Data

(63) Continuation-in-part of application No. 11/533,332, filed on Sep. 19, 2006, now Pat. No. 7,683,433, which is a continuation-in-part of application No. 11/029,542, filed on Jan. 4, 2005, now Pat. No. 7,224,205.

(60) Provisional application No. 60/780,383, filed on Mar. 9, 2006.

(51) Int. Cl.
*H03K 19/096* (2006.01)
(52) U.S. Cl. .............. 326/98; 326/93; 327/534
(58) Field of Classification Search ........... 326/93–98; 327/534
See application file for complete search history.

(56) References Cited

U.S. PATENT DOCUMENTS

| | | | |
|---|---|---|---|
| 3,921,035 A | 11/1975 | Holmes | |
| 4,412,308 A | 10/1983 | Bereron | |
| 5,365,102 A | 11/1994 | Mehrotra et al. | |
| 5,416,443 A | 5/1995 | Cranford et al. | |
| 5,440,243 A * | 8/1995 | Lyon | 326/33 |

(Continued)

FOREIGN PATENT DOCUMENTS

TW 419854 1/2001

(Continued)

OTHER PUBLICATIONS

Vora, M., et al., "A 2 Micron High Performance Bipolar 64K ECL Static RAM Technology With 200 Square Microns Contactless Memory Cell," 1984, IEDM Technical Digest 1984, pp. 690-693.

(Continued)

*Primary Examiner*—James H. Cho
*Assistant Examiner*—Jason M Crawford
(74) *Attorney, Agent, or Firm*—Michael A. Glenn; Glenn Patent Group

(57) ABSTRACT

Metal-oxide semiconductor (MOS) transistors that are operable at voltages below 1.5V, that are area efficient, and that exhibit improved drive strength and leakage current that are disclosed. A dynamic threshold voltage control scheme is used that does not require a change to existing MOS technology processes. Threshold voltage of the transistor is controlled, such that in the Off state, the threshold voltage of the transistor is set high, keeping the transistor leakage to a small value. The advantages provided by apply to dynamic logic, as well as in the specific well separation imposed by design rules because well potential difference are lower than the supply voltage swing.

7 Claims, 13 Drawing Sheets

U.S. PATENT DOCUMENTS

| | | | |
|---|---|---|---|
| 5,559,451 A | | 9/1996 | Okamura |
| 5,701,093 A * | | 12/1997 | Suzuki ................... 326/98 |
| 5,753,955 A * | | 5/1998 | Fechner .................. 257/347 |
| 5,760,449 A | | 6/1998 | Welch |
| 5,763,960 A | | 6/1998 | Ceccherelli et al. |
| 5,821,769 A * | | 10/1998 | Douseki ................... 326/34 |
| 5,831,451 A * | | 11/1998 | Bosshart .................. 326/93 |
| 6,018,168 A | | 1/2000 | Yang |
| 6,034,563 A | | 3/2000 | Mashiko |
| 6,081,107 A | | 6/2000 | Marino |
| 6,118,328 A * | | 9/2000 | Morikawa ................. 327/534 |
| 6,177,703 B1 | | 1/2001 | Cunningham |
| 6,194,276 B1 | | 2/2001 | Chan et al. |
| 6,198,173 B1 | | 3/2001 | Huang |
| 6,204,105 B1 | | 3/2001 | Jung |
| 6,204,696 B1 * | | 3/2001 | Krishnamurthy et al. ...... 326/98 |
| 6,225,827 B1 | | 5/2001 | Fujii et al. |
| 6,294,816 B1 | | 9/2001 | Baukus et al. |
| 6,359,477 B1 | | 3/2002 | Pathak |
| 6,384,639 B1 | | 5/2002 | Chen et al. |
| 6,411,560 B1 | | 6/2002 | Tanizaki et al. |
| 6,429,482 B1 | | 8/2002 | Culp et al. |
| 6,441,647 B2 * | | 8/2002 | Jeon ........................ 326/98 |
| 6,465,849 B1 | | 10/2002 | Chang et al. |
| 6,521,948 B2 | | 2/2003 | Ebina |
| 6,593,799 B2 | | 7/2003 | De et al. |
| 6,600,187 B2 | | 7/2003 | Kim |
| 6,621,292 B2 | | 9/2003 | Sakata et al. |
| 6,628,551 B2 | | 9/2003 | Jain |
| 6,643,199 B1 | | 11/2003 | Tang et al. |
| 6,674,123 B2 | | 1/2004 | Kim |
| 6,690,039 B1 | | 2/2004 | Nemati et al. |
| 6,693,333 B1 | | 2/2004 | Yu |
| 6,707,708 B1 | | 3/2004 | Alvandpour et al. |
| 6,711,063 B1 | | 3/2004 | Dejenfelt et al. |
| 6,711,088 B2 | | 3/2004 | Hayashi et al. |
| 6,787,850 B1 * | | 9/2004 | Pelloie ..................... 257/347 |
| 6,891,389 B1 | | 5/2005 | Walker et al. |
| 6,894,324 B2 | | 5/2005 | Ker et al. |
| 6,898,116 B2 | | 5/2005 | Peng |
| 6,933,744 B2 * | | 8/2005 | Das et al. ................... 326/17 |
| 6,940,317 B2 | | 9/2005 | Suga |
| 6,958,519 B2 | | 10/2005 | Gonzalez et al. |
| 6,969,888 B2 | | 11/2005 | Williams et al. |
| 7,064,942 B2 | | 6/2006 | Ker et al. |
| 7,132,711 B2 | | 11/2006 | Forbes et al. |
| 7,253,485 B2 | | 8/2007 | Shibahara |
| 2001/0054886 A1 | | 12/2001 | Takahashi et al. |
| 2002/0096723 A1 | | 7/2002 | Awaka |
| 2002/0153957 A1 | | 10/2002 | Jordanov |
| 2002/0154462 A1 | | 10/2002 | Ker et al. |
| 2002/0195623 A1 | | 12/2002 | Horiuchi |
| 2003/0089951 A1 | | 5/2003 | Ker et al. |
| 2003/0178648 A1 | | 9/2003 | Bonsal |
| 2004/0004298 A1 | | 1/2004 | Madurawe |
| 2004/0022109 A1 | | 2/2004 | Yoon et al. |
| 2004/0077151 A1 | | 4/2004 | Bhattacharyya |
| 2004/0252546 A1 | | 12/2004 | Liaw |
| 2005/0035410 A1 | | 2/2005 | Yeo et al. |

FOREIGN PATENT DOCUMENTS

| | | |
|---|---|---|
| TW | 479852 | 3/2002 |
| TW | 480773 | 3/2002 |
| TW | 495106 | 7/2002 |

OTHER PUBLICATIONS

Takamiya, M., et al., "High Performance Electrically Induced Body Dynamic Threshold SOI MOSFET (EIB-DTMOS) with Large Body Effect and Low Threshold Voltage," 1998, IEDM Technical Digest.

Diaz, C.H., et al., "Device Properties in 90nm and beyond and implications on Circuit Design," 2003, IEEE.

Rabaey, J., "Issues in Low Power Design—Managing Leakage," Aug. 23, 2004, Dept. of Electrical Engineering and Computer Sciences, University of California at Berkeley.

Bohr, M., "High Performance Logic Technology and Reliability Challenges," Apr. 1, 2003, IPRS, Intel.

Fallah, et al., "Standby and Active Leakage Current Control and Minimization in CMOS VLSI Circuits," Apr. 2004, IEIC Trans. On Electronics, Special Section on Low-Power LSO and Low Power IP. vol. E88-c, No. 4.

Cao, et al., "Reducing Dynamic Power and Leakage Power for Embedded Systems," Sep. 2002, ASIC-SOC Conference, 15th Annual IEEE International, Vol. Uss.

Min. et al., "Zigzag Super Cut-Off CMOS (ZSCCMOS) Block Activation with Self-Adaptive Voltage Level Controller: An alternative to Clock-Gating Scheme in Leakage Dominant Era," 2003 International Solid-State Circuits Conference, Digest of Technical Papers ISSCC, IEEE International.

Henzler, et al., "Fast Power-Efficient Circuit -Block Switch-Off Scheme," Jan. 22, 2004, Electronics Letters, vol. 40. No. 2.

Narendra, et al., "Full Chip Subthreshold Leakage Power Prediction and Reduction Techniques for sub-0.18um CMOS," Mar. 2004, IEEE Journal of Solid State Circuits, vol. 39, No. 2, pp. 501-510.

Kao, et al., "Dual-Threshold Voltage Techniques for Low-Power Digital Circuits," Jul. 2000, IEEE Journal of Solid-State Circuits, vol. 35, No. 7.

Kuroda, et al., "A 0.9-V, 150MHz, 10-mW, 4mm2, 2-D Discrete Cosine Transform Core Processor with Variable Threshold-Voltage (VT) Scheme," Nov. 1996, IEEE Journal of Solid-State Circuits, vol. 31, No. 11.

Tschanz, et al., "Adaptive Body Bias for Reducing Impacts of Die-to-Die and within-die Parameter Variations on Microprocessor Frequency and Leakage, Solid State Circuits Conference," Feb. 2002, Digest of Technical Papers, ISSCC, 2002 IEEE International, vol. 1.

von Arnim, et al., "Efficiency of Body Biasing in 90-nm CMOS for Low-Power Digital Circuits, Jul. 2005, IEEE Journal of Solid State Circuits," vol. 40, No. 7, pp. 1549-1556.

Borkar, S., "Circuit Techniques for Subthreshold Leakage Avoidance, Control, and Tolerance," 2004, IEEE.

* cited by examiner

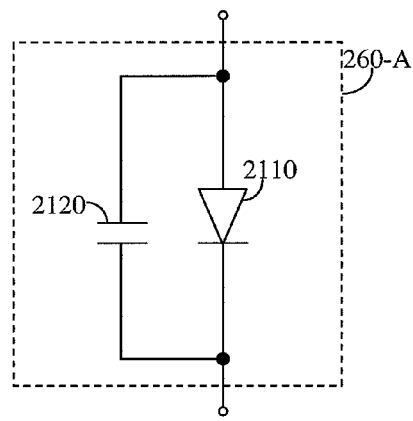
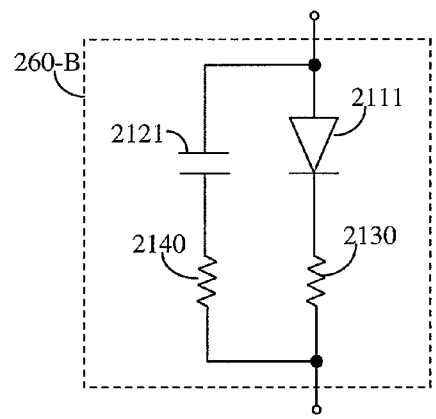
FIGURE 12A　　　　　　　　FIGURE 12B
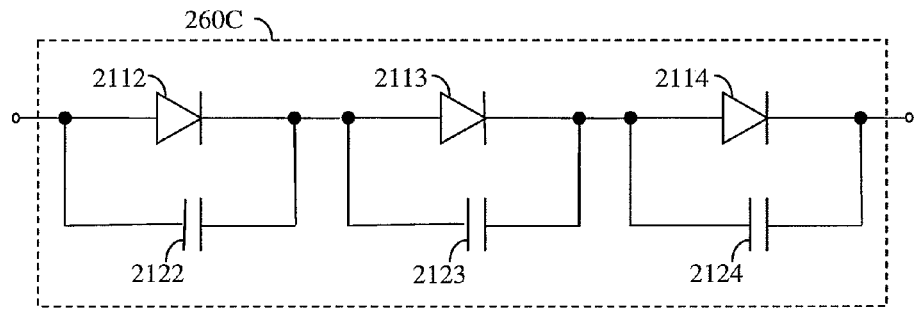
FIGURE 12C
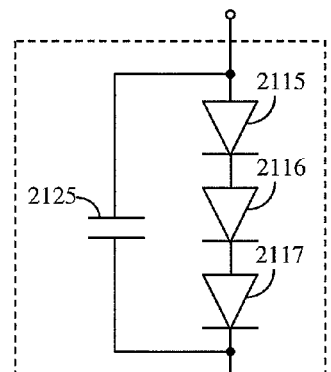
FIGURE 12D

METHOD AND APPARATUS FOR DYNAMIC THRESHOLD VOLTAGE CONTROL OF MOS TRANSISTORS IN DYNAMIC LOGIC CIRCUITS

CROSS REFERENCE TO RELATED APPLICATIONS

This application is continuation-in-part of U.S. patent application Ser. No. 11/533,332 filed Sep. 19, 2006, now U.S. Pat. No. 7,683,433 which is a continuation-in-part of U.S. patent application Ser. No. 11/029,542, filed Jan. 4, 2005, now U.S. Pat. No. 7,224,205, the entirety of each of which is incorporated herein by this reference thereto. This application claims priority to U.S. provisional patent application Ser. No. 60/780,383, filed Mar. 9, 2006, which document is incorporated herein in its entirety by this reference thereto.

BACKGROUND OF THE INVENTION

1. Technical Field

The invention relates generally to MOS based transistors and MOS based cells. More specifically, the invention relates to the improvement of drive strength, current leakage, and stability of deep submicron MOS transistors and of memory cells using deep submicron MOS transistors.

2. Description of the Prior Art

Conventional complementary metal-oxide semiconductor (CMOS) technology currently poses some difficult problems as improvements in such technology shrink the minimum feature size to below 100 nanometers and reduce power supply voltage to less than 1.0V. A typical layout of a 0.18 micron transistor 100 is shown in FIG. 1. The transistor is manufactured over a well 110 where a diffusion area 120 is created. The gate 130 of the transistor 100 is formed over the well 120 and has a width "w," for example 0.18 micron, as a minimum width for a transistor in a 0.18 micron technology. Contacts 140 and 141 comprise one terminal of the NMOS transistor, for example the drain, and a contact 150 provides another terminal of the transistor 100, for example the source. The contact 131 is connected to the gate 130. There are other minimal feature sizes, such as a minimal size for the well "x" and a minimum distance from the edge of the well to the diffusion area 120 marked as "y." Dimensions such as "w," "x," and "y" are generally process dependent.

The power supply voltage is reduced in correspondence with the minimum feature size to maintain a limit on the electrical field across the oxide. Therefore, the power supply voltage is decreased from 3.3V for 0.35-micron CMOS technology to 1.8V for 0.18 micron technology, and is further expected to be at the 1.0V level for 100 nanometers CMOS technology.

While power supply voltage is decreased, the threshold voltage of the NMOS transistors stays between 0.45V and 0.35V. The relationship between the NMOS threshold voltage $V_{th}$ and CMOS power supply $V_{DD}$ is known to be very critical. The threshold voltage determines the leakage current, $I_{off}$ of the transistor when it is in its OFF state. As the threshold voltage is driven lower, the leakage current increases.

The drain current of a transistor is a direct function of the overdrive of the transistor, measured as the difference between power supply $V_{DD}$ and threshold voltage $V_{th}$. The drain current of the transistor determines the time required to charge the load capacitance from ground to the level of power supply $V_{DD}$. This overdrive voltage decreases constantly as the power supply is decreased from 3.3V to 1.0V, while the threshold voltage decreases only from 0.45V to 0.35V. For 0.1 micron technology, the threshold voltage of the transistors is scaled below 0.35V at the expense of a very high OFF stage leakage current $I_{OFF}$ which ranges between 10 nA to 100 nA for a transistor having equal gate length and width, or a W/L ratio of 1. For a transistor with a gate width to length (W/L) ratio of 10, the OFF current increases to ten times the value stated above, i.e. from 100 nA to 1000 nA. For a CMOS technology of 0.1-micron minimum feature size, a typical VLSI chip is expected to contain over 100 million gates. Thus, a leakage of every gate of 1 microamperes results in 100 amperes of leakage current.

A scheme to control the threshold voltage dynamically has been proposed by Takamiya et al. in an article titled *High Performance Electrically Induced Body Dynamic Threshold SOI MOSFET (EIB-DTMOS) with Large Body Effect and Low Threshold Voltage*. Takamiya et al. suggest a scheme that shorts the gate and the substrate of the transistors, thereby causing the substrate voltage of the transistor to increase as the gate voltage is increased for a n-channel MOS (NMOS) transistor. This scheme is proposed for NMOS transistors fabricated on silicon-on-insulator (SOI) substrates, where the transistor substrate is totally isolated. This scheme manipulates the threshold voltage by changing the bias of the substrate in the positive direction for a NMOS transistor along with a positive signal at the gate. As the substrate-to-source voltage becomes positive, the depletion layer width is reduced. This results in a lower threshold voltage for the transistor, thereby increasing the current from the transistor. In the native form, the Takamiya et al. invention is applicable only for circuits using power supply voltage of less than 0.6V because this scheme relies upon the substrate-to-source diode. The leakage from this diode must be limited. Otherwise, one type of leakage would be traded for another, i.e. from drain-to-source leakage to substrate-to-source leakage.

Douseki, in U.S. Pat. No. 5,821,769, describes a method for the control of the threshold voltage of a MOS transistor by connecting a MOS transistor between the gate and the substrate. The Douseki invention requires the addition of a transistor for every transistor whose threshold voltage is dynamically controlled. The adjusted threshold voltage is fixed by the power supply voltage and the threshold voltage of the additional transistor. The area penalty is fairly large for the Douseki invention, although it can be executed without additional process steps.

There is a therefore a need in the art for a technology which can reduce the leakage of MOS transistors without adversely affecting the drive current or the drain current under saturation conditions, which conditions are stated as drain-source voltage and gate-source voltage equal to the power supply voltage ($V_{DS}=V_{GS}=V_{DD}$). Furthermore, there is therefore a need in the art for a technology which can reduce the leakage of memory cells using deep submicron MOS transistors, without adversely affecting other characteristics of the memory cell. Preferably, such a solution will not change standard manufacturing processes and, preferably, such technology will be further applicable to multiple types of memory cells. It would be further beneficial if the technology be adoptable for use with the popular dynamic logic. It would be of additional benefit if the design methods provide designs where the area impact of the invention is minimized to preserve chip area.

SUMMARY OF THE INVENTION

Metal-oxide semiconductor (MOS) transistors that are operable at voltages below 1.5V, that are area efficient, and that exhibit improved drive strength and leakage current that are disclosed. A dynamic threshold voltage control scheme is used that does not require a change to existing MOS technology processes. Threshold voltage of the transistor is controlled, such that in the Off state, the threshold voltage of the transistor is set high, keeping the transistor leakage to a small value. The advantages provided by apply to dynamic logic, as well as in the specific well separation imposed by design rules because well potential difference are lower than the supply voltage swing.

BRIEF DESCRIPTION OF THE DRAWINGS

FIG. 12A-12D are schematic diagrams showing various control circuits $Z_C$ implemented according to the invention;

DETAILED DESCRIPTION OF THE INVENTION

Briefly, the invention adds a circuit to an NMOS transistor, resulting in an increase in the drive current while the transistor is in an ON state, and a reduction of the leakage current while the transistor is in an OFF state. Specifically, this is achieved by implementing the control circuit between the gate and the substrate of the transistor. The control circuit is various realized and can comprise a resistance, or it can comprise one or more diodes. In operation, the control circuit forces a high threshold voltage $V_{TH}$ in the OFF state for the NMOS transistor and a low $V_{TH}$ in the ON state for the NMOS transistor. A detailed description of the disclosed invention follows.

Figure 1:
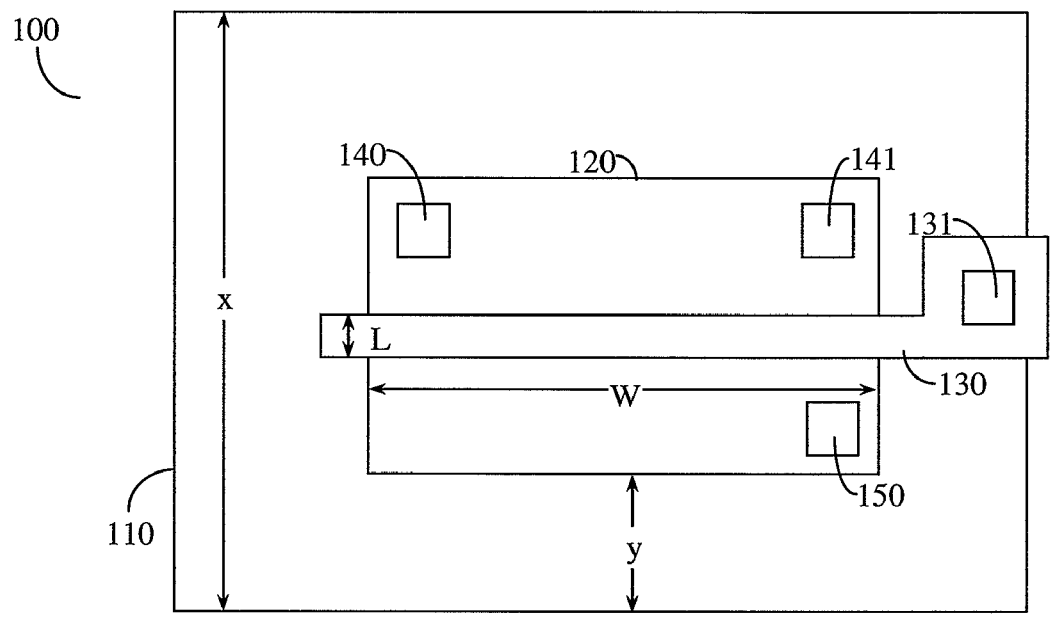
FIG. 1 is a schematic showing a typical layout of a 0.18 micron transistor (prior art)
Figure 2:
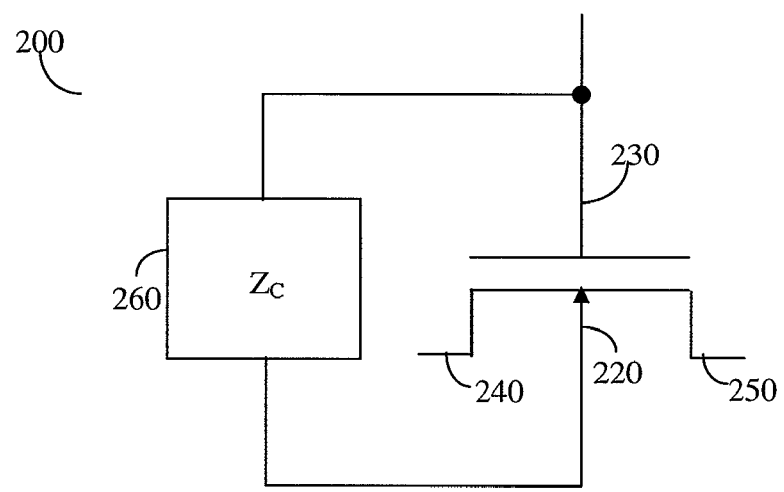
FIG. 2 is a schematic diagram of a control circuit $Z_C$ connected between the gate and substrate terminals of a NMOS transistor according to the invention.

FIG. 2 is a schematic diagram of a circuit 200 in accordance with the invention. A control circuit $Z_C$ 260 is connected to an NMOS transistor which comprises a substrate 220, a gate 230, a drain 240, and a source 250. The control circuit is connected between the gate 230 and the substrate 220. The control circuit $Z_C$ implements a dynamic voltage control by using, for example, various types of diodes to control substrate voltage. By controlling the threshold voltages such that they are different when the transistor is in the ON and OFF state, an improvement in drive current in the ON state and leakage current in the OFF state is achieved.

Furthermore, the invention provide an extremely area efficient implementation for dynamic threshold voltage control, as described in detail below. The threshold voltage is modulated by changing the net charge in the depletion layer beneath the gate. This is commonly known as "body effect," and its strength, that is, the change in threshold voltage associated with a change in the effective substrate voltage, is increased by higher values of substrate doping in the region immediately beneath the gate.

Figure 3:
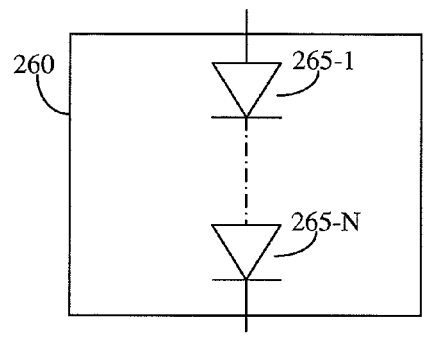
FIG. 3 is a schematic diagram of the control circuit $Z_C$ of FIG. 2 according to the invention.

FIG. 3 shows a control circuit 260 comprised of a plurality of diodes 265. The control circuit 260 may comprise of one or more diodes connected between the gate 230 and the substrate 220 of the NMOS transistor. The dynamically adjusted threshold voltage is varied by adjusting the diode layout geometry. No variations in the manufacturing process are required. However, in one embodiment of the invention, discussed in more detail below, such variations are shown and provide additional benefits.

The diodes are fabricated in any of a variety of techniques as detailed further. One such type is that of diffused diodes. These diodes are conventional diodes that are fabricated by diffusing n-type and p-type layers into an isolated structure. The voltage across the diodes is controlled by adjusting the doping profiles in silicon and programming the area, thereby controlling the voltage drop across the diode.

Figure 4A:
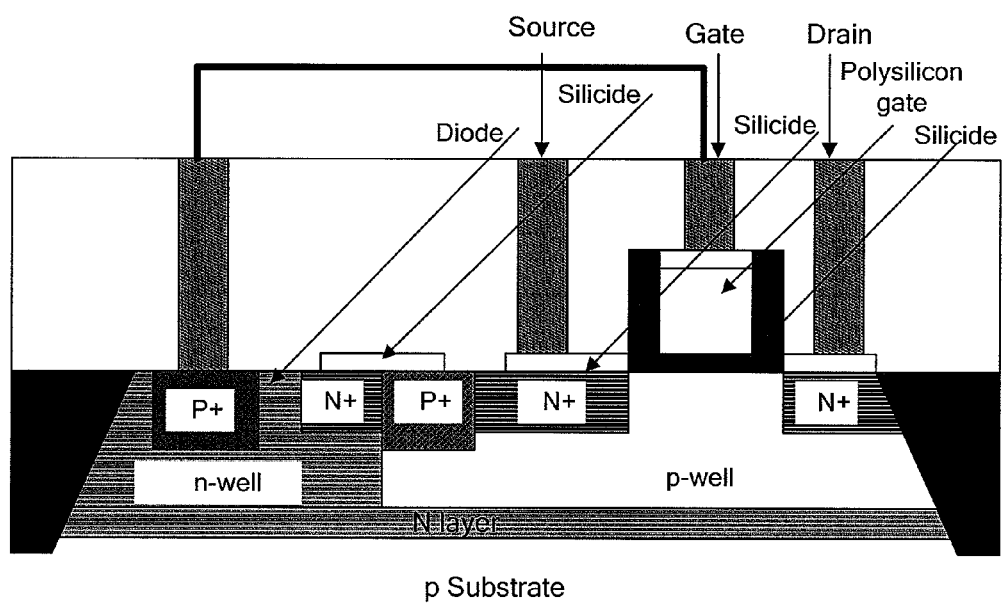
FIG. 4A is a cross-section of an NMOS transistor having a diffused diode control circuit $Z_C$ according to the invention.
Figure 4B:
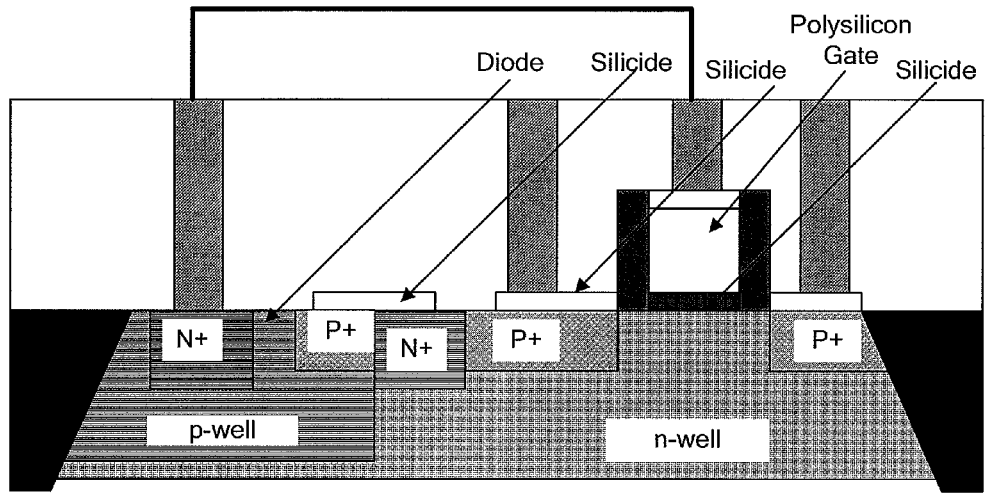
FIG. 4B is a cross-section of a PMOS transistor having a diffused diode control circuit $Z_C$ according to the invention.

FIGS. 4A and 4B show cross sections of a circuit 200 using diffused diodes. The diffused diodes are conventional diodes that are used to adjust the bias voltage at the well. The diodes are formed differently for NMOS and PMOS transistors. The NMOS transistors are formed in a region isolated from the p-type substrate by a deep N type implant. This isolation is achieved by existing triple well CMOS technology, as is known to those skilled in the art. This isolation can also be achieved by a deep N type implant in the region of NMOS transistors. The implant can comprise phosphorous, with an implant dose ranging from $1\times10^{11}/cm^2$ to $1\times10^{14}/cm^2$, and an energy ranging from 50 KeV to 5 MeV. The implant is annealed at temperatures ranging from 900° C. to 1150° C. for 15 seconds to 2 hours.

In one embodiment of the invention, the diodes for use with NMOS structures are formed in an area adjoining the NMOS, next to the well tap in the same isolation area or in another suitable location. The area containing the diode additionally receives the n-well implant to form the cathode.

One implementation of the invention uses a process step which is used to form the n-well region for PMOS transistors.

This is done by using, for example, phosphorous or arsenic ions, with doping in the range of $1E11/cm^2$ and $5E14/cm^2$, at an implant energy in the range of 25 KeV and 400 KeV. The N type isolation implant and the N-well implant form a contiguous N type semiconductor region. An n+ contact region is formed in the implanted n-well region near the surface to provide the Ohmic contact for the cathode. The anode region is formed by the p+ implant that is used for making the p+ source/drain regions for the PMOS transistor. The anode and cathode regions are formed using the source and drain implants for PMOS and NMOS, respectively. The implant dose and energy are determined by the electrical characteristics of the transistor. The diode can be connected to the well contact with standard metallization, or to save space, a silicide strap formed by in-situ, self-aligned silicidation of silicon by reacting it with titanium, cobalt, nickel, or any other suitable metal may be provided to short the cathode of the diode with the well contact of the NMOS.

In a PMOS implementation, shown in FIG. 4B, the transistor itself is isolated by the virtue of being formed in the N-well, and no additional steps are needed to form the region for isolating the transistor and the diode from the substrate. In an exemplary embodiment, the anode region of the diode is formed by an anti-punch through boron implant as is used for NMOS transistors, or by another suitable implant step. To insure a contiguous P type region for the diode in the N-well, an additional p-type implant using boron or indium, with dose in the range of 1E12 to $1E15/cm^2$, and implant energy in the range of 5 KeV to 200 KeV, may be used to form the anode region of the diode. The Ohmic contact to the anode region is formed by the source/drain implant for the PMOS transistor. The cathode region of the diode is formed by the n+ implant, which is the same implant as the source/drain implant for the NMOS transistor. A silicide strap is formed by in-situ self aligned silicidation of silicon by reacting it with titanium, cobalt, nickel, or any other suitable metal to short the anode of the diode with the well contact of the PMOS.

Another type of diode that may be used to practice the invention is an integrated polysilicon diode. These diodes are formed by contacting n-type and p-type polysilicon to an underlying silicon of an opposite polarity. The polysilicon layers are the same as those that are used to build the gate of the MOS transistors. These diodes are formed by preventing the formation of the gate oxide underneath the transistor gates, or by removing the oxide prior to the deposition of polysilicon. The voltage across the diodes is adjusted by controlling the doping profiles in silicon and programming the area of the diodes.

Figure 4C:
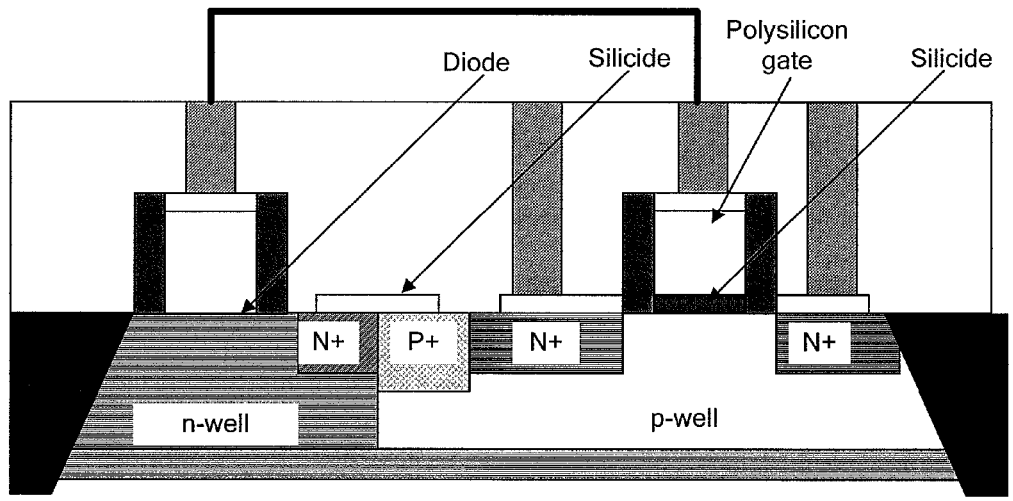
FIG. 4C is a cross-section of an NMOS transistor having a self-aligned diode control circuit $Z_C$ according to the invention.

FIG. 4C shows a cross section of a circuit 200 having a self-aligned diode control circuit $Z_C$. The diodes are formed by depositing polysilicon on top of the regions where gate oxide has been prevented from growing during the thermal oxidation cycle, or where it has been removed prior to the deposition of polysilicon by an appropriate process step. The wafers are processed through a typical CMOS process by implanting well regions and forming the isolation oxide using any of the established processes.

An additional process step is performed to form the isolation region where NMOS transistors are to be formed, and is carried out as described above.

Next, the threshold adjust implants are made. The growth of silicon dioxide on selected areas is accomplished by selectively implanting the area of silicon where the oxide is to be prevented from growth with a photoresist mask covering the rest of the wafer. This is achieved by implanting this region with nitrogen atoms by ion implantation to a dose of $1E14/cm^2$ to $1E16/cm^2$ at an implant energy of 2 KeV to 50 KeV.

The wafers are then taken through the gate oxidation cycle, as may be required by the process, to achieve the appropriate electrical characteristics of the transistor. Thus, oxidation of the implanted regions is prevented while the oxidation of silicon region on the remaining wafer takes place.

Alternately, the gate oxide is etched selectively using a mask from the region where the oxide has to be removed. A layer of polysilicon is deposited next on the wafer and the regular CMOS process steps are conducted. The polysilicon layer is doped to form a conductivity region n+ and p+ for NMOS and PMOS transistor gates, respectively. An Ohmic electrical connection between the diode terminal and the well terminal is made with the help of the self-aligned silicide, which is an essential part of the CMOS process step.

In an alternate embodiment of the invention, the gate oxide underneath the polysilicon on top of the diode region is damaged by the appropriate dopant type to change the electrical characteristic of the oxide to allow it to conduct an electrical charge. For NMOS transistors, a phosphorous or arsenic implant, and for PMOS transistors a boron implant, with a dose of $1 \times 10^{13}$ to $1 \times 10^{16}$ atoms/cm$^2$, and with an energy ranging from 25 KeV to 200 KeV, is used to implant the polysilicon layer and damage the underlying gate oxide in the region of the diode to form an electrically conducting electrode.

In another embodiment of the invention, an inert atom such as argon is used to damage the gate oxide, using implant energy and dose deemed essential to cause irreparable damage to the gate oxide layer.

Yet another type of diode that may be used to practice the invention is the in-line polysilicon diode. These are the most area and process efficient structures and are created by implanting n-type and p-type dopant separated laterally in a line of polysilicon. The voltage drop across the diodes is controlled by programming the location of the n-type and p-type implants and their doses used to form the diodes.

Figure 4D:
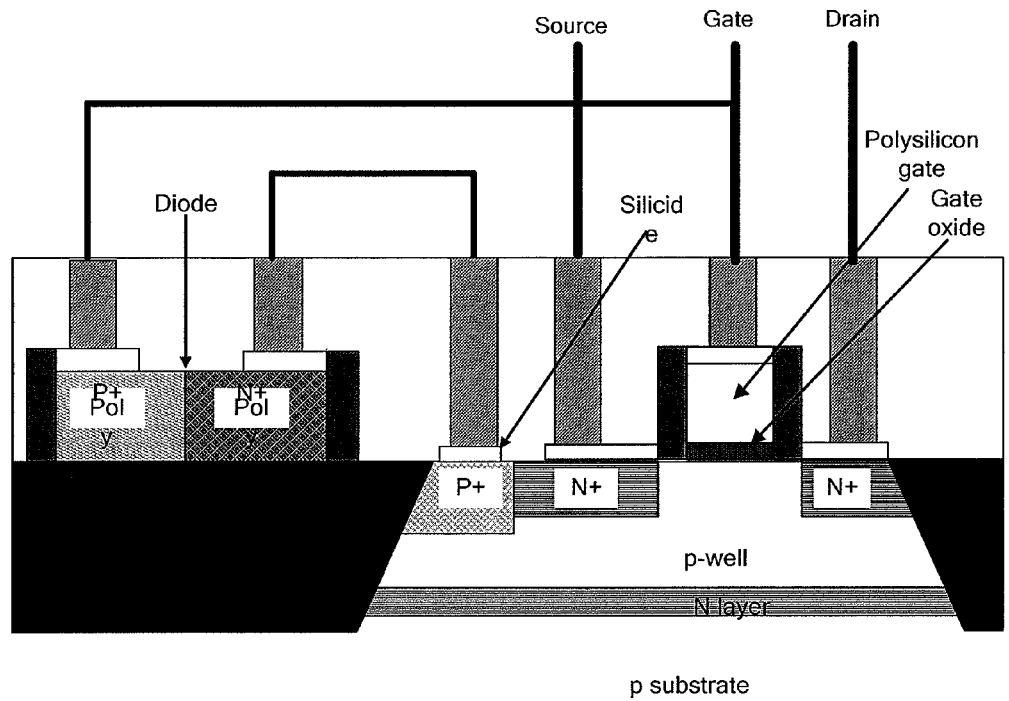
FIG. 4D is a cross-section of an NMOS transistor having a poly diode control circuit $Z_C$ according to the invention.

FIG. 4D is a cross section of a circuit 200 having a poly diode control circuit $Z_C$. In one embodiment of the invention, a lateral diode is formed in a line of polysilicon between the n+ and p+ polysilicon regions, where the electrical characteristics of the polysilicon diode are controlled by the lateral isolation between the n+ and p+ regions in polysilicon. The p+ and the n+ regions of polysilicon are formed by the source/drain implants of the NMOS and PMOS transistors. The polysilicon is doped, for example, with phosphorous, arsenic, or antimony to a dose in the range of $5 \times 10^{14}$ to $5 \times 10^{16}/cm^2$, at an energy in the range of 5 KeV to 200 KeV. The p+ region is formed by doping polysilicon with boron or indium to a dose in the range of $1 \times 10^{14}$ to $5 \times 10^{16}/cm^2$, at an energy in the range of 5 KeV to 200 KeV. The thickness of the polysilicon layer is determined by the transistor electrical characteristics. For 0.13 micron to 0.07 micron drawn dimensions, the thickness of the polysilicon layer is in the range of 1000 angstroms to 4000 angstroms. The space between the n+ and p+ implant regions is between −0.5 micron (overlap) to +2.0 micron (separation), and is programmed during mask layout. The lateral-masking dimension controls the barrier height of polysilicon diode. The layer of polysilicon is implanted with n+ and p+ on two sides having a lateral separation. A diode is formed at the intersection of the two regions. The forward characteristics of this diode are dependent upon the level of doping of the two impurity types in polysilicon and the separation between the two regions. Coincident mask layers (Is=0) or overlapping mask layers (negative Is) produce diodes having very high reverse leakage and low forward drop. On the other hand, with increasing separation of the n+ and p+ regions, the reverse leakage of the diode decreases and the forward drop across the diode increases.

Alternately, a polysilicon layer is uniformly implanted in the region of the diode by an N-type or P-type dopant, as the case may be, with a lower implant dose, such as $1\times10^{13}$-$5\times10^{15}$ atoms/cm$^2$ of appropriate doping species, and the desired region for the formation of anode or cathode is implanted with a heavier dose of the P or N type species with the dose of $2\times10^{13}$/cm$^2$-$5\times10^{16}$ atoms/cm$^2$. This arrangement does not require alignment of the N and P type implants, and relies strictly on the dopant concentration to determine the diode characteristics.

The isolation of the NMOS transistor obtained by this technique leaves the N type layer underneath the NMOS transistor floating, i.e. not in Ohmic contact with any node having a well-defined voltage. This configuration is used in the invention where the maximum voltage on the drain of the NMOS transistor is $V_{DD}$ ($\leq 1.5V$) that is less than two times the breakdown voltage of the p-n junction. One appropriate application of the invention is for systems using $V_{DD}$ at or below 1.0V, where the possibility of any parasitic action due to incidental forward biasing of any p-n junction is negligible. However, to safeguard against forward biasing of any parasitic p-n junction, an alternate embodiment of the invention comprises the formation of a deep Ohmic contact that extends from the drain of the NMOS transistor and that connects with the isolation N-layer underneath the NMOS. This N-type tap is formed by a multiplicity of deep ion implants of phosphorous or arsenic atoms in selected areas of the drain, such that the transistor characteristics are not adversely impacted. The exact ion implant dose and energy of this N-tap is dependant upon the device structure, and may be in the range of $1\times10^{11}$/cm$^2$ to $1\times10^{14}$/cm$^2$, and energy between 5 KeV and 2 MeV. LDD implants, which are common in high performance CMOS technology, may be used advantageously to provide the lower doping density required by the polysilicon diode.

In yet another embodiment of the invention, use is made of Schottky diodes. Schottky diodes are formed at the interface of a layer of a metallic material, for example titanium nitride, and n-type or p-type silicon. Schottky diodes can be formed on n-type and p-type silicon by carefully selecting the work function of the metallic layer and adjusting the Fermi level of the silicon by control of doping. The voltage across the diodes can be adjusted by changing the doping in the well and the diode area.

Figure 4E:
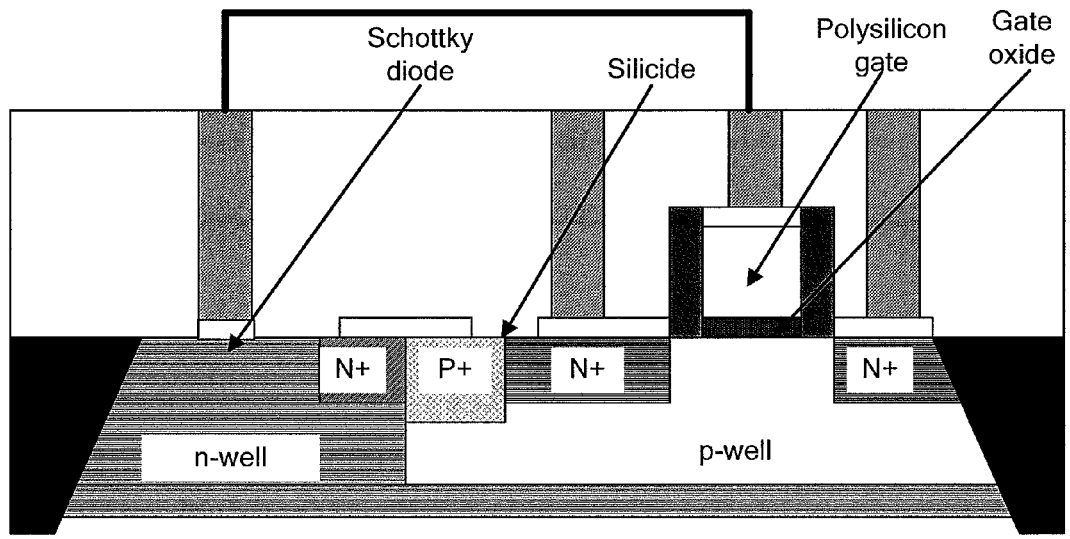
FIG. 4E is a cross-section of an NMOS transistor having a Schottky diode control circuit $Z_C$ according to the invention.

FIG. 4E shows a cross section of a circuit 200 having a Schottky diode control circuit $Z_C$. Taking advantage of the suitable band gap of, for example, TiN as the contact metal, Schottky diodes can be formed on both the n-type and p-type silicon with light doping of less than $1\times10^{17}$/cm$^3$. Thus, a Schottky diode for NMOS is formed by making, for example, a TiN to n-type diode in the n-well region. A Schottky diode for use with PMOS is formed in the p-well region adjoining the PMOS transistor.

In one embodiment of the invention, the well biasing scheme is only used for PMOS transistors that are built in a CMOS technology. The PMOS transistors are isolated as they are formed in the n-well regions, while NMOS transistors are formed in the p-well regions that are electrically connected to one another because they are formed over p-type silicon substrate as the starting substrate material.

To control the substrate voltage, one or more diode types can be used in a design by connecting them in series or parallel to obtain the appropriate voltage at the substrate, with an appropriate temperature coefficient. Also, the threshold voltage control can be applied to either or an NMOS or PMOS transistor, or to both transistors with appropriate diode types.

The invention covers the three cases, namely dynamic control of threshold voltage for NMOS only, for PMOS only, or that of both NMOS and PMOS.

For the purpose of explanation, it is assumed that the operating voltage $V_{DD}$ is 1.0V for a CMOS circuit. A CMOS buffer uses the NMOS transistor with the source-substrate diode area of Asn and the current-voltage characteristics are as follows:

$$V_f = V_t * \ln(I_{diode}/I_{sn0}) \quad (1)$$

where $V_t$ is the thermal voltage, $I_{diode}$ is the current passing through the well-substrate diode, and $I_{sn0}$ is the well-substrate diode saturation current.

An external diode $D_{ex}$ is used as a control device $Z_C$ 260. The voltage across the external diode is given by $$V_{f\_ex} = V_t * \ln(I_{diode}/I_{ex0}) \quad (2)$$

where $I_{ex0}$ is the diode saturation current of the external diode. Because the two diodes are in series, the same current flows through the diodes. The sum of the voltages across the two devices is equal to $$V_{DD} \cdot V_{DD} = V_f + V_{f\_ex} = V_t * \ln(I_{diode}/I_{sn0}) + V_t * \ln(I_{diode}/I_{ex0}) \quad (3)$$

Because $I_{sno}$ is fixed by the NMOS transistor characteristics, the voltage across the external diode is varied by changing the diode saturation current $I_{ex0}$, which is a product of the current density and the area. If the voltage drop across the two diodes is exactly equal, then the substrate voltage of the NMOS transistor is at 0.5V when the gate is at 1.0V. Reducing $I_{ex0}$ results in decreased voltage drop $V_f$ across the source-substrate diode and, hence, the threshold voltage of the NMOS transistor.

Figure 5:
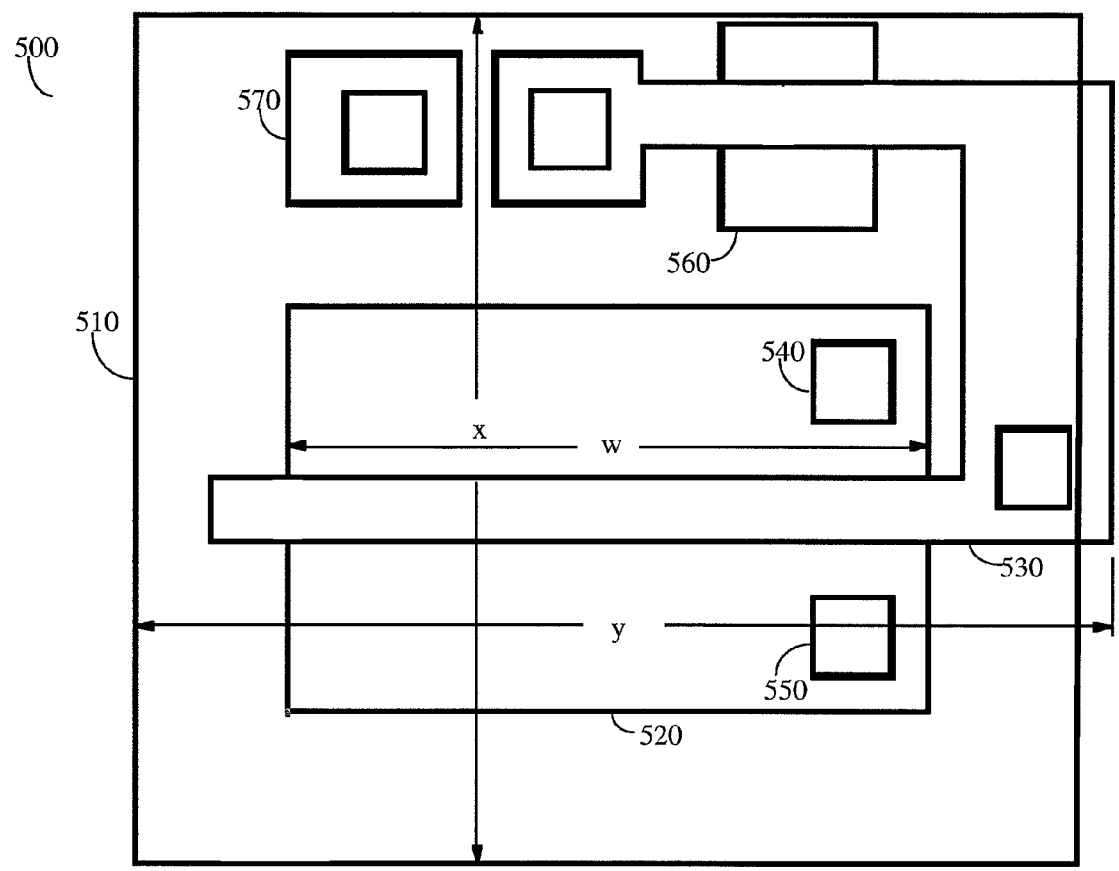
FIG. 5 shows a layout of an MOS transistor having a control circuit $Z_C$ according to the invention.

FIG. 5 shows a layout 500 of a MOS transistor having a control circuit $Z_C$. The MOS transistor is formed over a substrate 510 and a well 520, for example an n-well, over which a gate 530 is deposited which has an insulating layer in between the well 520 and the gate 530. Contacts 540 and 550 are connected, for example, to the drain and source of the MOS transistor, and a contact 535 is connected to the gate 530. Furthermore, a diode 560 is formed which may be connected to the substrate 570 by means of a metal path.

For a power supply voltage of 1.0V, the control circuit 260 comprises a single diode. The diode should sustain a forward drop of between 0.5V to 0.6V when connected in series with the substrate-to-source diode. The resulting voltage drop across the substrate-to-source diode is 0.5 to 0.4V. In one embodiment of the invention, the control circuit 260 is formed from a diffused diode. In another embodiment of the invention, the diode is formed from a single polysilicon diode or from two polysilicon diodes connected in parallel. For a power supply voltage of 0.9V, the bias control circuit 260 provides a forward drop of no more than 0.4V across the substrate-to-source diode.

For a 1.2V power supply the resulting forward bias voltage on the substrate-to-source diode is 1.2V. The control circuit $Z_C$ 260 is comprised of a single poly-diode having a large voltage drop. The doping across the poly diode is controlled such that, when the voltage at the gate terminal turns high, for example to 1.2V, the voltage drop across the polysilicon diode is nearly 0.7V and the drop across the source-substrate diode is 0.5V. This limits the leakage across the diode to less than ten nano-amperes per micron width, i.e. nearly a ten-fold reduction in leakage. With the source-to-substrate bias at −0.5V, the threshold voltage drops nearly 250 mV, resulting in an increase in the drain current of nearly 10-20% as compared to static threshold voltage.

Another embodiment of the invention uses a polysilicon diode in series with a Schottky diode that is formed by making TiN to n-type or p-type silicon.

In the case of a power supply of 1.5V, the NMOS and PMOS transistors have a threshold voltage of 0.45V, with an upper limit of 0.7V and a lower limit of 0.3V. These numbers refer to the magnitude of the voltage only because the threshold voltage of the PMOS devices is a negative quantity. The configuration of the control circuit $Z_C$ 260 depends upon the operating voltage. For a power supply voltage of 1.5V, the configuration of the control circuit $Z_C$ 260 is accomplished by using two diodes in series. The two diodes are made in polysilicon by doping the polysilicon with an n+ and p+ implant, and then using silicide to connect the gate of the NMOS transistor to the anode, or for a PMOS transistor to the cathode, of the first diode. Similarly, the cathode of the first diode is connected to the anode of the second diode with silicide. Because silicide is formed on the polysilicon layer in a self-aligned manner it does not require any contact hole or metal to be formed on the transistor. The diodes can also be formed on a silicon substrate. Furthermore, a combination of diodes formed on polysilicon and silicon substrates can be used. In an implementation of invention in SOI technology, the diode is formed on isolated islands that are insulated by oxide or by a set of polysilicon diodes, as described above.

Figure 6:
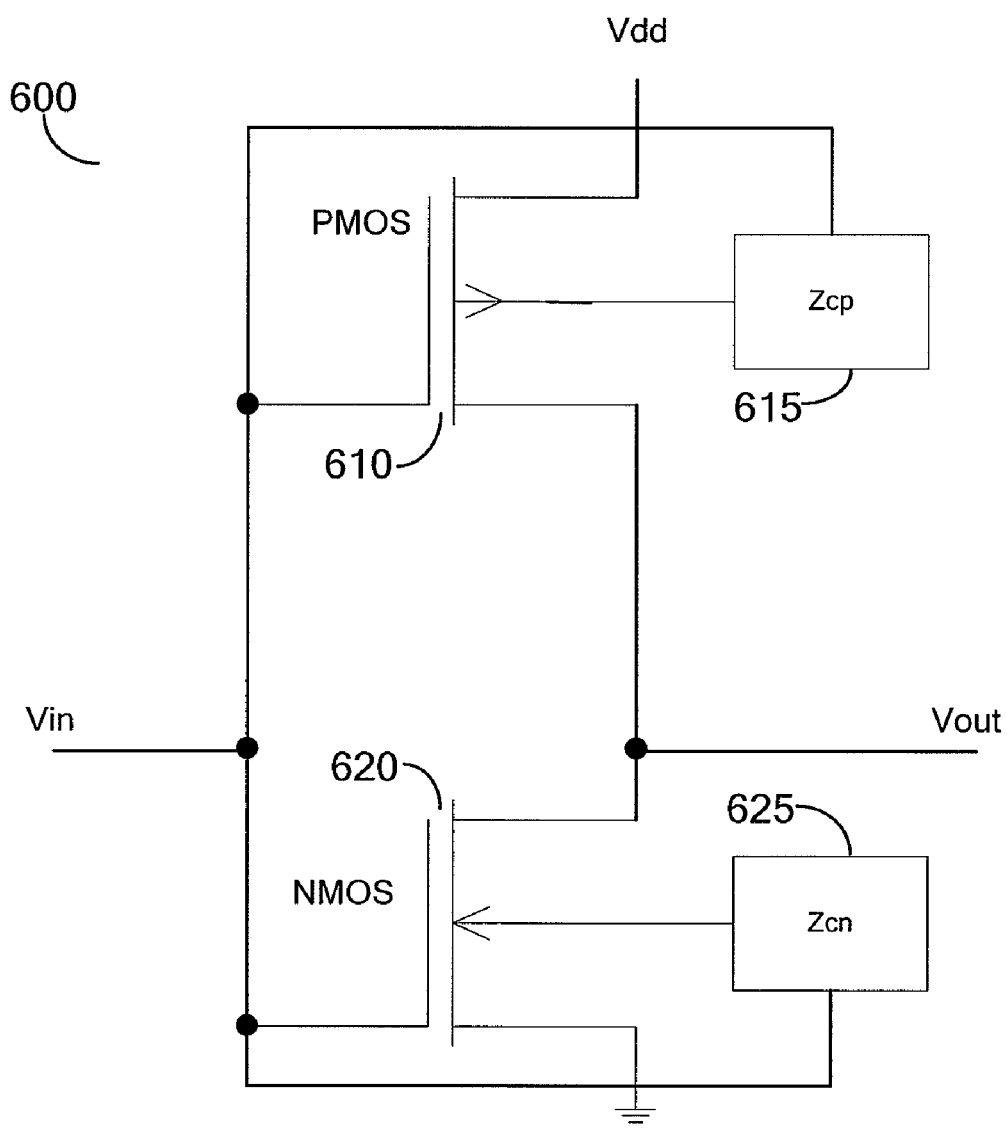
FIG. 6 is a schematic diagram showing an implementation of the invention in a CMOS buffer according to the invention.

FIG. 6 is a schematic diagram 600 of a CMOS buffer that is formed using the invention. Control circuits $Z_{C_n}$ 625 and $Z_{C_p}$ 615 are the active devices for controlling the threshold voltage of an NMOS transistor 620 and a PMOS transistor 610, respectively. The control circuits 615 and 625 are implemented in accordance with the disclosed invention.

Figure 7:
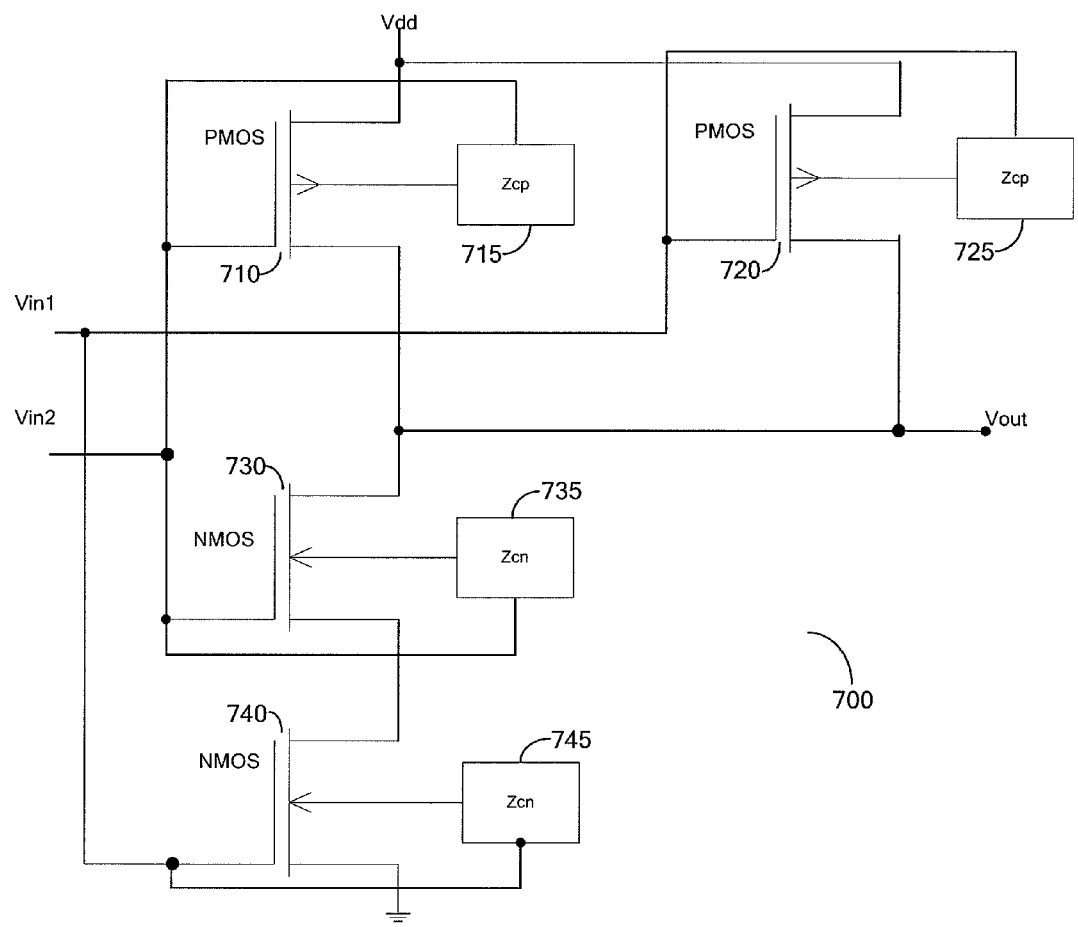
FIG. 7 is a schematic diagram implementation of the invention in a CMOS NAND gate according to the invention.

FIG. 7 is a schematic diagram 700 of a CMOS NAND gate that is formed using the invention. The two inputs to the NAND gate are $V_{in1}$ and $V_{in2}$, and $V_{out}$ shows the output of the circuit 700. The active circuits for controlling the threshold voltages of the NMOS transistors 730 and 740 are the control circuits $Z_{C_n}$ 735 and $Z_{C_n}$ 745, respectively. The active circuits for controlling the threshold voltages of PMOS transistors 710 and 720 are $Z_{C_p}$ 715 and $Z_{C_p}$ 725, respectively. The control circuits 715, 725, 735, and 745 may be customized for different transistors, as may be required by specific circuit configurations. The control circuits 715, 725, 735, and 745 are implemented in accordance with the invention.

In another embodiment of the invention the control circuits of the transistors in series, for the case of the NAND control circuits 735 and 745, may be removed to save area of the NAND cell 700. This is possible because the NMOS transistor connected in series restricts the leakage through that path. Similarly, in a NOR gate, where the PMOS transistors are in series, their respective control circuits may be omitted to save space.

In yet another embodiment a well-to-well space of wells having normally a full voltage swing equal to the power supply voltage may be reduced from 8*F, where F is the feature size of the specific design rule, down to 3*F, which is normally used for the distance between wells having a similar potential. The advantages of the design rules with respect to wells of transistors that have the adaptive voltage control in accordance with the invention are not limited to this circuit and may be used when applicable with respect to such circuits using the invention disclosed herein.

Figure 8:
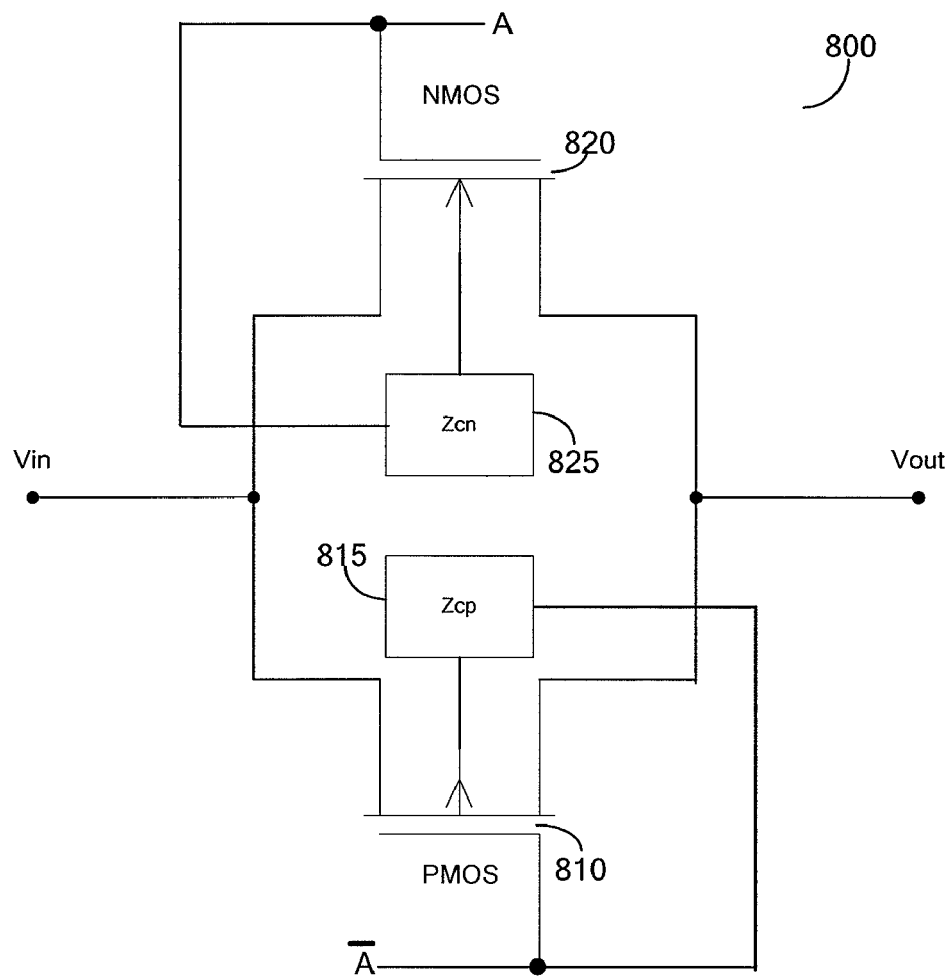
FIG. 8 is a schematic diagram showing an exemplary implementation of the invention in a CMOS pass gate according to the invention.

FIG. 8 is a schematic diagram 800 of a CMOS pass gate having a signal A that controls the status of the pass gate. The threshold levels of the NMOS transistor 820 are controlled by the control circuit $Z_{C_n}$ 825. The threshold levels of the PMOS transistor 810 are controlled by the control circuit $Z_{C_n}$ 815. The pass gate may also comprise only an NMOS transistor, for example the NMOS transistor 820, or only a PMOS transistor, for example the PMOS transistor 810, with the corresponding active threshold control device, as deemed appropriate for the specific application. The control circuits 815 and 825 are implemented in accordance with the invention.

While the description provided herein is for VDD voltages below 1.5V, the same apparatus and method can be implemented with appropriate modifications to VDD voltages higher than that. Furthermore, the descriptions herein are provided as examples of the invention and should not be viewed as limiting the scope of the invention. While NMOS implementations are shown herein, the invention can be equally used for PMOS transistors. Moreover, in a representative deep submicron CMOS process using 0.1 micron lithography, the change in leakage current from 0V substrate bias to −1V substrate bias for a PMOS transistor is much higher (nearly a factor of 10), while the leakage current change from 0V to −1V substrate bias for an NMOS transistor is lower (a factor of 3-3.5). This is due to the fact that the well region of the PMOS transistor is highly doped to counter dope against the diffusion of P+ source and drain. By contrast, the N+ source and drain region of an NMOS transistor are well controlled and, hence, the substrate doping is kept low, which leads to minimal change in leakage with substrate bias. Thus, a process change which increases the substrate doping I causes the amplification of the effect of the substrate voltage manipulation. This is also supported by the basic principles of MOS device physics which dictate that the impact of substrate bias on threshold voltage is enhanced with increasing substrate doping. This also results in an increase in the capacitance of the source and drain region. However, it has a minimal impact upon the circuit speed because the load capacitance in deep submicron CMOS VLSI circuits consists mainly of interconnect capacitance. Therefore, the use of a more highly doped substrate or well region, results in an increase in drain current by forward biasing. Alternately, for the same drain current, the leakage current is decreased. The device characteristics can also be optimized to increase the bulk doping level, as well as the gate oxide thickness, so that drain leakage and gate tunneling current are decreased simultaneously.

Figure 9:
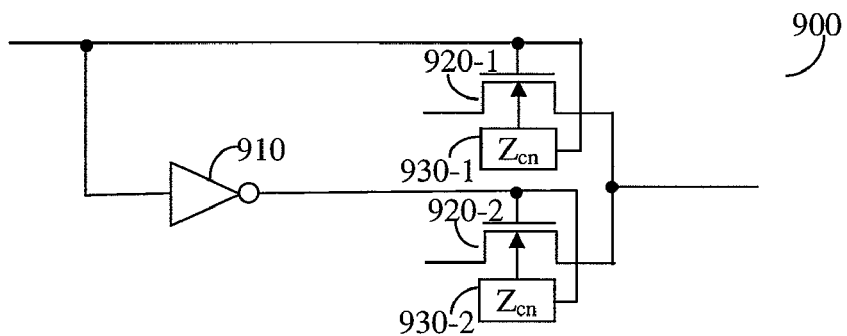
FIG. 9 is a schematic diagram showing a multiplexer implemented according to the invention.

FIG. 9 is a drawing of a multiplexer 900 in accordance with the invention. The multiplexer 900 comprises NMOS transistors 920-1 and 920-2, the gates of which are connected to a control signal. Transistor 920-2 receives an opposite control signal from the control signal received by the transistor 920-1. Inversion of the control signal is achieved by an inverter 910. The control circuits $Z_{C_N}$ 930-1 and 930-2 provide the adaptive threshold voltage scheme herein disclosed. In one embodiment of the multiplexer 900, the inverter 910 is implemented to include the adaptive voltage control circuitry, as discussed in detail above. In another embodiment of the invention, the inverter 910 is implemented without the control circuits, thereby saving on the area of the multiplexer cell. In yet another embodiment of the invention, a multiplexer comprised of a plurality of transistors 920 is provided. In this case, each gate has a respective control signal. These control signals must ensure that no two transistors may be active simultaneously to avoid contention of signals when the drain-to-source path are opened and connected to a single output. Each of the transistors 920 has, in accordance with the invention, an adaptive voltage control circuit 930 connected between the gate of the respective transistor 910 that is controlled by the adaptive voltage control circuit 930 and the substrate node of the same transistor 910. In yet another embodiment, a well-to-well space of wells having normally a full voltage swing equal to the power supply voltages, may be reduced from 8*F, where F is the feature size of the specific design rule, down to 3*F, which is normally used for the distance between wells having a similar potential.

Figure 10:
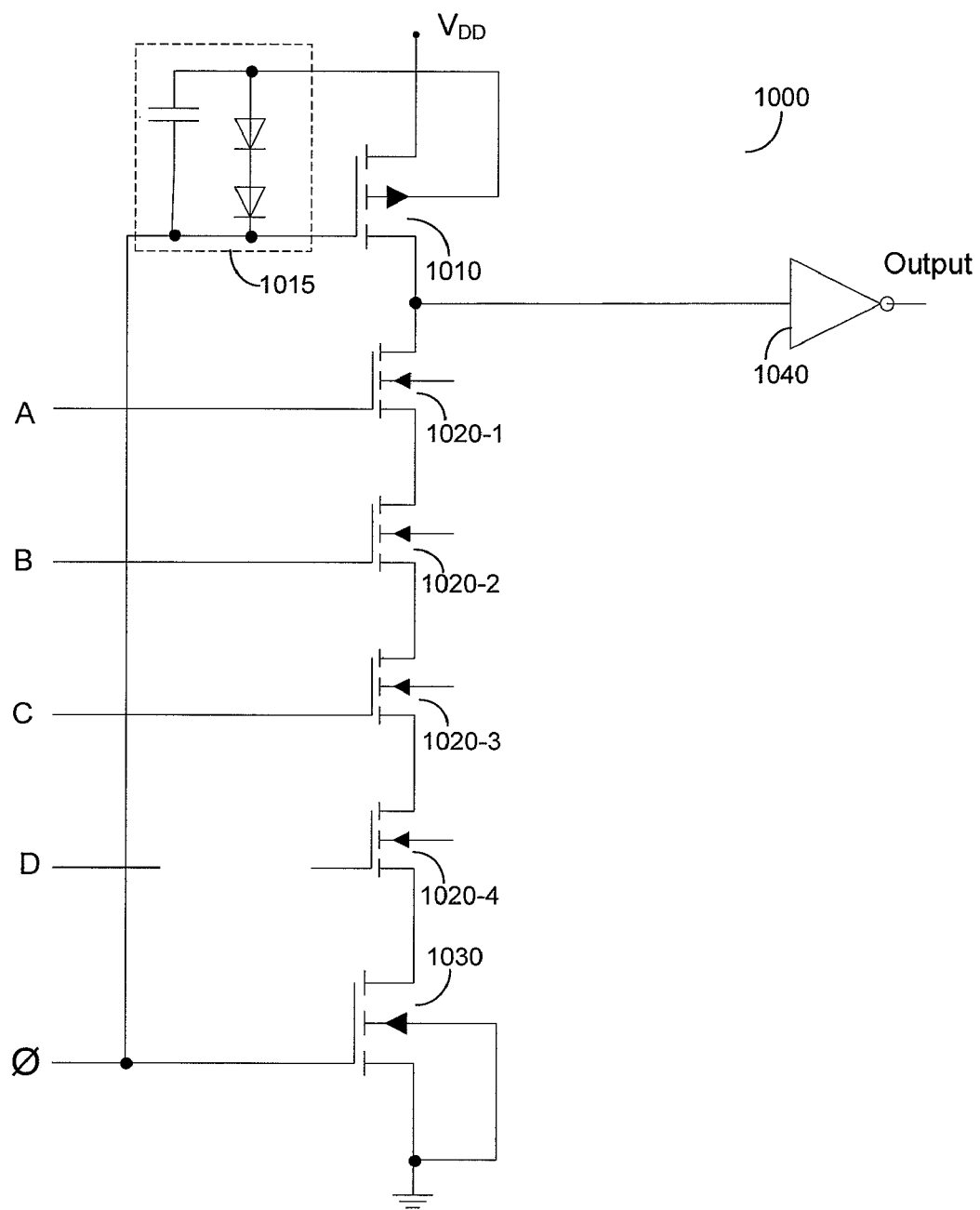
FIG. 10 is a schematic diagram showing a dynamic logic circuit configured with an adaptive threshold voltage according to the invention.

FIG. 10 shows a dynamic logic circuit 1000 that is configured with an adaptive threshold voltage in accordance with the invention. Dynamic logic circuits are well known in the art and are now commonly used in deep-submicron designs for a variety of reasons. However, the dynamic logic, which may take various forms of which only the exemplary design is shown in FIG. 10, contributes to the overall problem of leakage. In a dynamic logic design there are two phases of operation. The first is the precharge phase, where the PMOS transistor 1010 is active and precharges at least the point for output connected to the output inverter 1040. During this precharge phase, the NMOS transistor 1030 is OFF and therefore no discharge path is available to the precharging nodes. During the evaluation phase, the transistors 1010 are in the OFF position. while the NMOS transistor is in the ON position, allowing for a discharge path. The transistors 1020, for example transistors 1020-1 through 1020-4 receive inputs A through D, respectively, and based on their specific positions may either enable a discharge, if all are ON, or, not providing a discharge path, if at least one of these are transistors 1020 is OFF. In accordance with the invention, and for the purpose of reducing leakage of circuit 1000, an adaptive voltage control circuit 1015 the types of which described in greater detail throughout this invention is connected between the gate of transistor 1010 and its respective transistor substrate.

Figure 11:
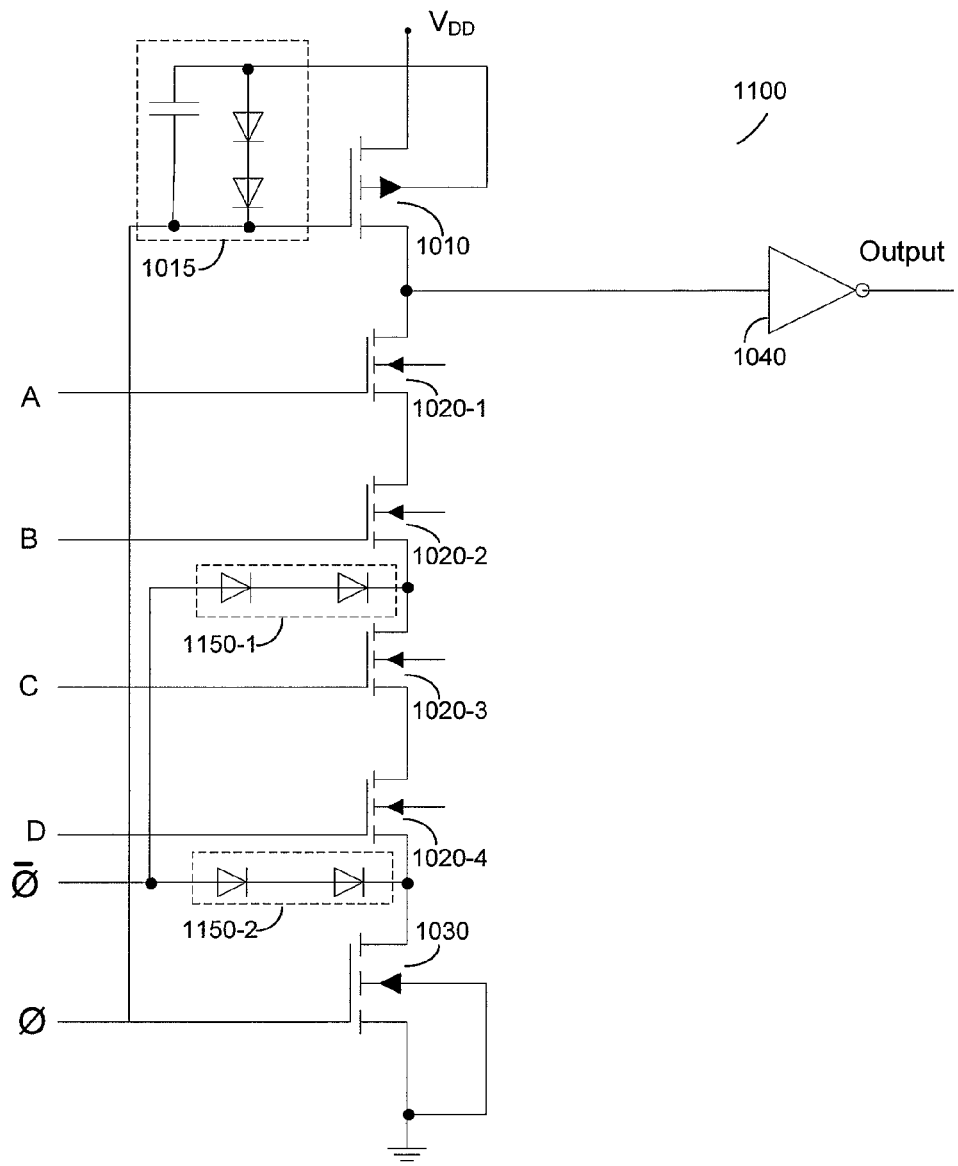
FIG. 11 is a schematic diagram showing a dynamic logic circuit configured with an adaptive threshold voltage and an diode based node precharge circuits according to the invention.

FIG. 11 shows a dynamic logic circuit that is designed to overcome the problem of precharging of nodes between two subsequent NMOS transistors 1020. The problem is that it is possible that any of these nodes may be pulled-down to a low potential during the evaluation period. Then, during the precharge phase such nodes are not recharged to a high value and, at a subsequent evaluation phase, may, cause a discharge or unwanted transition due to the pull-down effect such a potential may have. This phenomena is well-known in the art and leakage circuitry that mildly supplies current from a circuit that is active in parallel to the PMOS transistor 1010 is commonly used. However, this adds significantly to the overall leakage current of the circuit. To overcome this problem, an enhanced circuit 1100 is shown in FIG. 11. This circuit is equipped with diodes 1150, for example ploy diodes, connected to a control signal which is the inverse of the control signal driving the PMOS transistor 1010. The diodes 1150 are provided, for example, for every pair of NMOS transistors 1020 and precharge the nodes to which they are connected during the precharge phase, thereby preventing the problems discussed with respect to prior art solutions. This is achieved by charging the nodes during the precharge phase, rather than during the evaluation phase where the circuitry requires a continuous supply of charge during the evaluation phase. In addition, the area occupied by the diodes 1150 is significantly smaller than the solutions provided in the prior art because the inverter driving the inverted control signal is shared by a plurality of such dynamic logic gates. A person skilled in the art would realize that such circuit 1150 may be used in a dynamic logic circuit that may have or may not have the adaptive threshold voltage control circuit 1015. In one embodiment of the invention, the circuit 1015 is comprised of a capacitor only without the diodes.

FIG. 12 show a plurality of configurations for control circuit $Z_C$ 260. The circuits can equally apply for use with both PMOS and NMOS transistors. Specifically, the circuits shown in FIGS. 12A-12D include, in addition to at least a diode as described above, at least a capacitor. The use of a capacitor in parallel with a diode in a circuit $Z_C$, enables the waveform at the well terminal to be controlled. In the absence of the capacitor, the transient waveform of the well may be subject to significant influence by the transient voltage at the output terminal, resulting in an anomalous increase in leakage current under transient conditions. Therefore, the capacitor allows the well voltage to track the input voltage more accurately under transient conditions. Tracking help is needed because the tiny currents of the diodes do not move the well voltage quickly enough to allow full drive current for short pulses. In addition, the counteracting of the Miller effect is also a factor in the use and determination of the value of such a capacitor. Hence, in one embodiment of the invention a capacitor is connected in parallel with the diode as part of the control circuit $Z_C$ 260.

FIG. 12A shows a control circuit 260A in which a capacitor 2120 is connected in parallel with a single diode 2110.

Figure 13:
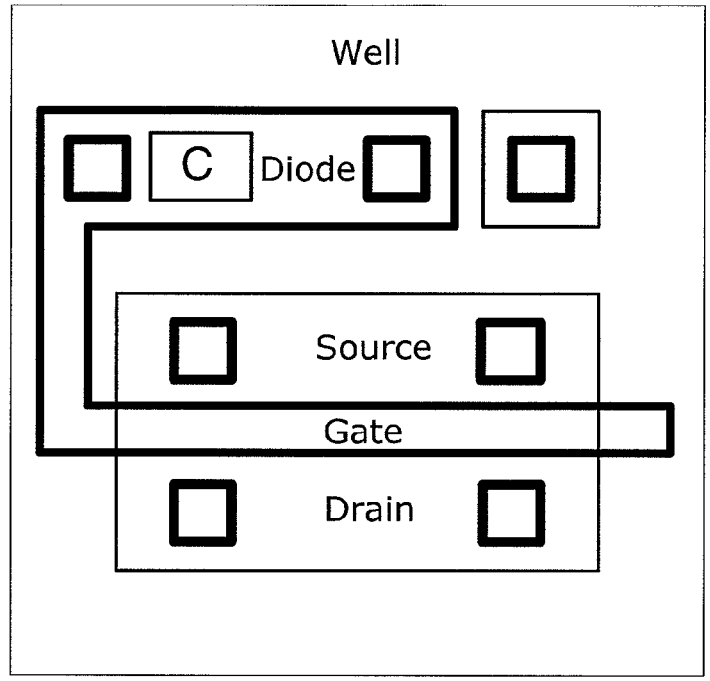
FIG. 13 is a schematic diagram showing a layout of a control circuit $Z_C$ that includes a capacitor according to the invention.

An exemplary circuit layout that includes a MOS transistor in combination with the control circuit 260A is shown in FIG. 13.

FIG. 12B shows a control circuit 260B, in which a diode 2111 is in series with a resistor 2130, and a capacitor 2121 is in series with a resistor 2140.

FIG. 12C shows a control circuit 260C, in which a plurality of diodes, for example diodes 2112, 2113, and 2114, are connected to a parallel capacitor, for example capacitors 2122, 2123, and 2124, respectively. The actual number of diodes is determined by the exact circuit application. Another configuration employing multiple diodes is shown in FIG. 12D, in which a single capacitor 2125 is connected in parallel with a plurality of diodes, for example diodes 2115, 2116 and 2117. Each of these diodes and capacitors may be replaced by the same circuit element in series with a resistor as shown, for example, in FIG. 12B above. Any combination of these circuit elements in series and/or parallel can also be used for optimum circuit performance, and are specifically part of the invention. This is shown in FIG. 12D.

The preferred value of the capacitor for control of the voltage waveform is related to the capacitance of the gate oxide. This capacitance value ranges between 0.01 to 100 times the value of the gate capacitance. An important factor in choosing the feed-forward capacitor is the total capacitance of the well relative to other portions of the device. Such capacitance is typically similar in magnitude to the gate capacitance. Ideally, the capacitance voltage division is identical to the voltage division established by the diodes. In another embodiment of the invention, performance reasons may cause a deviation from that standard. Multiple methods can be used to realize this capacitance. The resistors and capacitors shown in FIG. 12A-12D can be realized by many different methods.

FIG. 13 shows an implementation of the control circuit with a capacitor in parallel to the diodes, where the capacitor is formed in the region marked C, between the polysilicon and an underlying thin oxide layer, on top of the well region which is electrically connected to the body of the NMOS transistor. In a preferred embodiment, the arrangement of the capacitor from p+ poly over a p-well and n+ poly over an n-well is preferred over a capacitor that is formed of n+ poly over p-well and so on. The former styles are much less likely to form inversion layers, which reduces the dynamic capacitance. In an alternate embodiment, the capacitor is constructed using a metal-insulator-metal (MIM) implementation, known to those skilled in the art. These capacitors are formed by introducing a thick layer of oxide between two layers of metal. In yet another embodiment, a metal-oxide-metal (MoM) capacitor is used, which is formed by the fringing capacitance between inter-digitated metal fingers. The metal capacitors discussed herein have the advantage of being in a different plane from other components of the circuit, and therefore do not contribute materially to the layout area.

Figure 14:
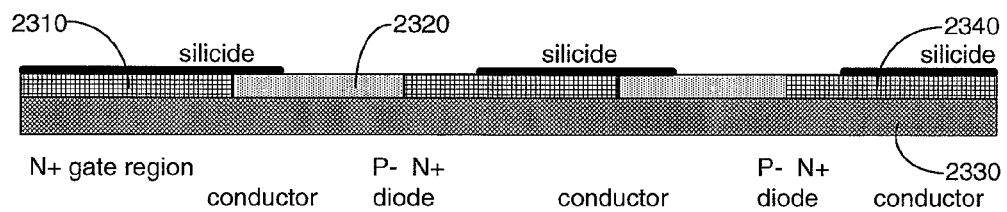
FIG. 14 is a cross-section showing two lateral poly diodes according to the invention.
Figure 15:
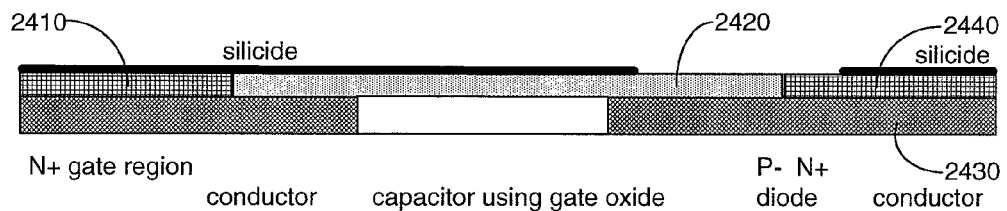
FIG. 15 is a cross-section showing a capacitor and a single lateral poly diode according to the invention.

FIGS. 14 and 15 show implementations of lateral poly diodes such diodes may be used to form the control circuits discussed above. Formation of such diodes is discussed in detail in Vora et al, *A* 2 *Micron High Performance Bipolar* 64*K ECL Static RAM Technology With* 200 *Square Microns*

*Contactless Memory Cell,* IEDM Technical Digest, pp. 690-693, (1984), which is incorporated herein in its entirety by this reference thereto. FIG. 14 shows a pair of p– to n+ diodes as deployed as part of the Zc network 260 for an NMOS transistor. Element 2310 is n+ poly, element 2320 is p– poly, and element 2330 is field oxide. FIG. 14 shows a similar structure for a capacitor and one lateral poly diode, where the element 2310 is n+ poly, element 2320 is p– poly, and element 2330 is field oxide. In both cases, the contact to the relevant p-well is made from point 2340 or 2440, respectively.

Figure 16:
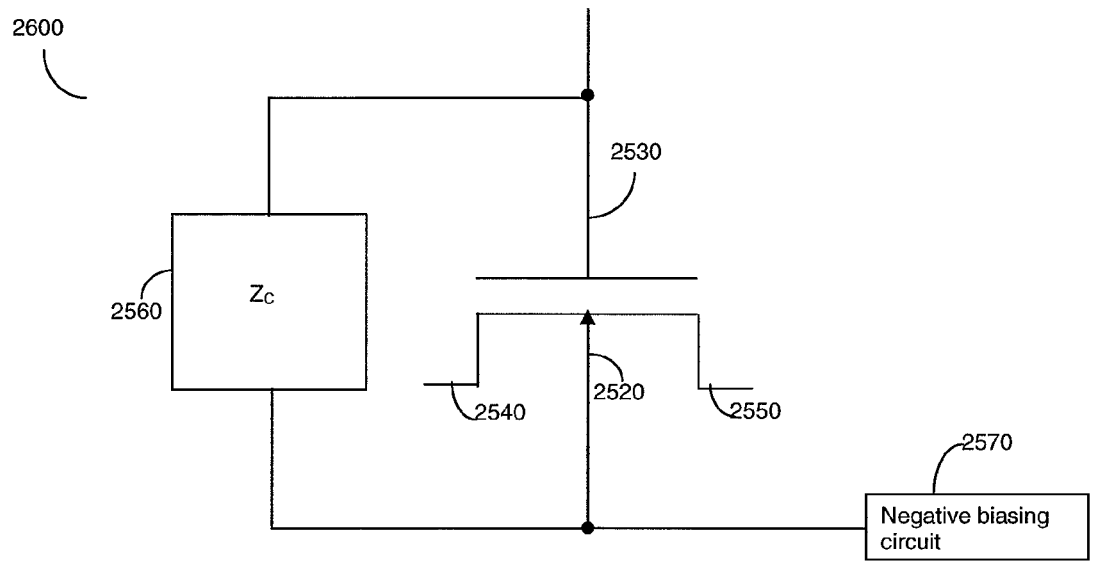
FIG. 16 is a schematic diagram showing an implementation of a positive well bias and a negative well bias according to the invention.

FIG. 16 shows an embodiment of the invention which includes an additional circuit to implement negative bias on the p-well of an NMOS transistor. The elements 2520 through 2560 have the same description as elements 220 through 260 of FIG. 2, respectively. In addition, a negative bias control 2570 is configured to provide a negative bias to the well 2520. The negative bias reduces the threshold voltage of the NMOS transistor. The impact of applying negative bias to the threshold voltage of NMOS is well documented and known to those skilled in the art. Equivalently, for PMOS transistors, a positive bias is applied to increase the magnitude of its threshold voltage. The bias discussed herein is applied in such a manner that it does not interfere with the operation of the device. In an exemplary embodiment of the invention, a bias circuit 2570 is activated when there is no activity on the input 2530 of the MOS transistor. During the period when the input voltage at gate 2530 is expected to be varied, the negative biasing circuitry is disconnected from the well 2520 by a negative bias control 2570.

Figure 17:
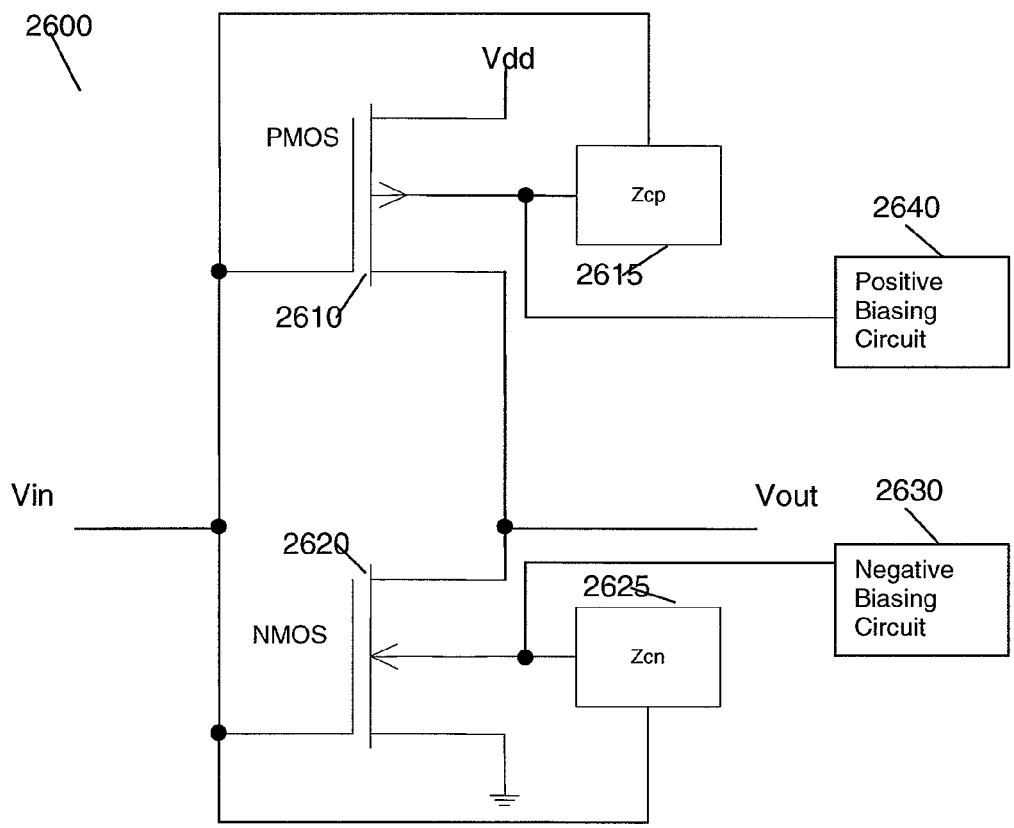
FIG. 17 shows an implementation of a CMOS buffer using a positive well bias and a negative well bias according to the invention.

FIG. 17 shows an embodiment of the invention with regard to well biasing as it applies to a CMOS inverter. The various elements numbered 2600 through 2625 have the same description and function as elements 600 through 625, respectively of FIG. 6 the bias controls 2630 and 2640 are circuit elements that are configured to provide a negative voltage and a positive voltage to the wells of the NMOS and PMOS transistors, respectively, when the inputs of the transistors are inactive. A person skilled in the art would realize that this configuration may be extended to other circuits without departing from the spirit of the invention, and such circuits are hereby specifically included.

A person skilled in the art would further notice that in the case where two or more of the same type MOS gates, for example n-channel gates, may be connected in series, e.g. a NAND gate, leakage current from the MOS gates in series is significantly reduced. Similarly, in circuits where two or more p-channel gates may be connected in series, e.g. NOR gates, leakage current from the MOS gates in series is significantly reduced. Therefore, in such cases it may not be necessary to configure those MOS gates connected in series with the control circuit $Z_C$. However, for two or more MOS gates connected in parallel, having such a control circuit $Z_C$ for each of the MOS gates reduces their leakage current. In one embodiment of the invention, MOS gates connected in parallel share a common isolated well, i.e. P-well for n-channel devices and N-well for p-channel devices, and a single control circuit $Z_C$.

Although the invention is described herein with reference to the preferred embodiments, one skilled in the art will readily appreciate that other applications may be substituted for those set forth herein without departing from the spirit and scope of the present invention. Accordingly, the invention should only be limited by the Claims included below.

The invention claimed is:

1. A dynamic logic circuit, comprising:
 a PMOS transistor for precharging a node during a precharge phase controlled by a precharge phase signal;
 a first NMOS transistor for floating a circuit during said precharge phase;
 a plurality of additional NMOS transistors connected between a source terminal of said PMOS transistor and a source terminal of said first NMOS transistor, said plurality of additional NMOS transistors performing a logic function during an evaluation phase of said dynamic logic circuit; and
 an adaptive threshold voltage control circuit connected between a gate terminal and a transistor substrate terminal of said PMOS transistor; said adaptive voltage control circuit comprising any of a forward biased junction diode formed in an isolated structure, a capacitor, and a forward biased junction diode formed in an isolated structure connected in parallel with a capacitor.

2. The dynamic logic circuit of claim 1, further comprising:
 a precharge circuit connected to a first node of said plurality of additional NMOS transistors, said precharge circuit connecting a source terminal to a drain terminal of two NMOS transistors that are connected in series with said plurality of additional NMOS transistors, said precharge circuit comprising of one or more junction diodes, the cathode of a last junction diode of said one or more junction diodes being connected to said first node, and an anode of a first diode being connected to receive a control signal comprising an inverted signal of said precharge phase control signal.

3. The dynamic logic circuit of claim 1, wherein at least two NMOS transistors of said plurality of additional NMOS transistors are connected in a NAND configuration.

4. The dynamic logic circuit of claim 1, wherein at least two NMOS transistors of said plurality of additional NMOS transistors are connected in a NOR configuration.

5. A dynamic logic circuit, comprising:
 a PMOS transistor for precharging a node during a precharge phase;
 a first NMOS transistor for floating a circuit during said precharge phase;
 a plurality of additional NMOS transistors connected between a source terminal of said PMOS transistor and a source terminal of said first NMOS transistor, said plurality of additional NMOS transistors performing a logic function during an evaluation phase; and
 a precharge circuit connected to a first node of said plurality of additional NMOS transistors to connect a source terminal to a drain terminal of two NMOS transistors which are connected in series with said plurality of additional NMOS transistors; said precharge circuit comprising of one or more junction diodes, the cathode of a last diode of said one or more junction diodes being connected to said node, and an anode of a first diode of said one or more junction diodes being connected to receive a control signal comprising an inverted signal of a precharge phase control signal.

6. The dynamic logic circuit of claim 5, wherein at least two NMOS transistors of said plurality of additional NMOS transistors are connected in a NAND configuration.

7. The dynamic logic circuit of claim 5, wherein at least two NMOS transistors of said plurality of additional NMOS transistors are connected in NOR configuration.

* * * * *